(12) United States Patent
Chung et al.

(10) Patent No.: US 7,609,120 B2
(45) Date of Patent: Oct. 27, 2009

(54) VOLTAGE-CONTROLLED OSCILLATOR USING LC RESONATOR

(75) Inventors: Yu Jin Chung, Gyeonggi-do (KR); Bum Man Kim, Gyeongsangbuk-do (KR); Jong Ryul Lee, Gyeonggi-do (KR); Kwang Jun Yun, Gyeonggi-do (KR)

(73) Assignee: FCI Inc. (KR)

( * ) Notice: Subject to any disclaimer, the term of this patent is extended or adjusted under 35 U.S.C. 154(b) by 416 days.

(21) Appl. No.: 11/574,041

(22) PCT Filed: Aug. 26, 2005

(86) PCT No.: PCT/KR2005/002823

§ 371 (c)(1), (2), (4) Date: Feb. 21, 2007

(87) PCT Pub. No.: WO2006/025670

PCT Pub. Date: Mar. 9, 2006

(65) Prior Publication Data

US 2009/0051453 A1    Feb. 26, 2009

(30) Foreign Application Priority Data

Aug. 30, 2004   (KR) .................. 10-2004-0068721

(51) Int. Cl.
*H03B 5/18* (2006.01)
(52) U.S. Cl. ............. 331/167; 331/117 R; 331/117 FE; 331/177 V
(58) Field of Classification Search ............ 331/117 R, 331/117 FE, 177 V, 167
See application file for complete search history.

(56) References Cited

U.S. PATENT DOCUMENTS 6,204,734 B1 *   3/2001   Zhang et al. ............ 331/117 R

FOREIGN PATENT DOCUMENTS

| JP | 07-176952 | 7/1995 |
| JP | 2002-208819 | 7/2002 |
| JP | 2003-204219 | 7/2003 |
| JP | 2003-229718 | 8/2003 |
| JP | 2004-140471 | 5/2004 |

OTHER PUBLICATIONS

PCT Written Opinion for International Application No. PCT/KR2005/002823; Date of mailing: Nov. 28, 2005.
PCT International Search Report for International Application No. PCT/KR2005/002823; Date of mailing: Nov. 28, 2005.

* cited by examiner

*Primary Examiner*—Arnold Kinkead
(74) *Attorney, Agent, or Firm*—Jae Y. Park; Kile Goekjian Reed & McManus

(57) ABSTRACT

Provided is a voltage-controlled oscillator (VCO) using an LC resonator circuit which includes a first resonance circuit in which two serially connected varactor diodes and an inductor are connected in parallel, a second resonance circuit in which one or more inductor L1 and one or more capacitor C1 are connected in parallel, the second resonance circuit being serially connected to a port of the first resonance circuit, and a third resonance circuit in which one or more inductor L2 and one or more capacitor C2 are connected in parallel, the third resonance circuit being serially connected to the other port of the first resonance circuit.

3 Claims, 2 Drawing Sheets

[Fig. 1]
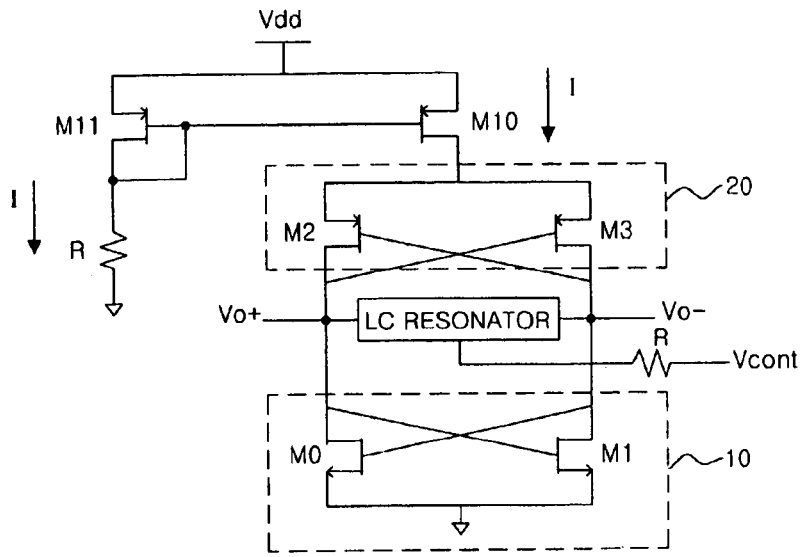
[Fig. 2]
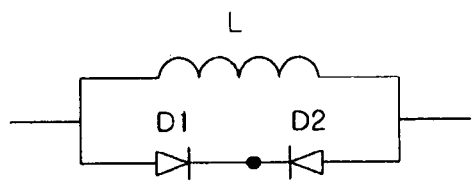
[Fig. 3]
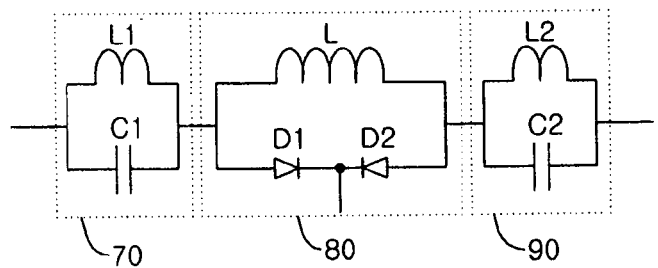
[Fig. 4]
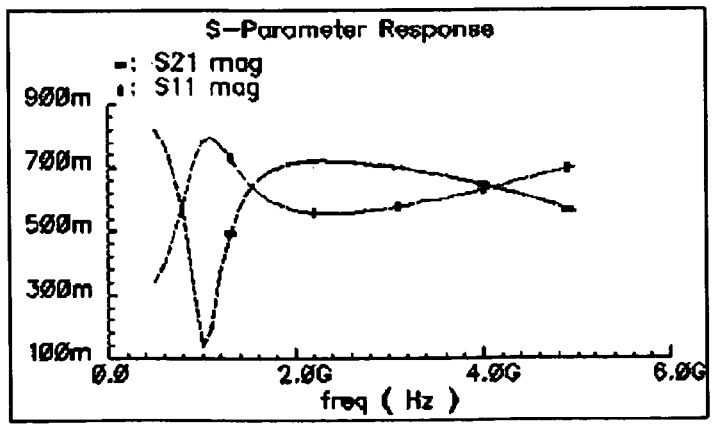

[Fig. 5]
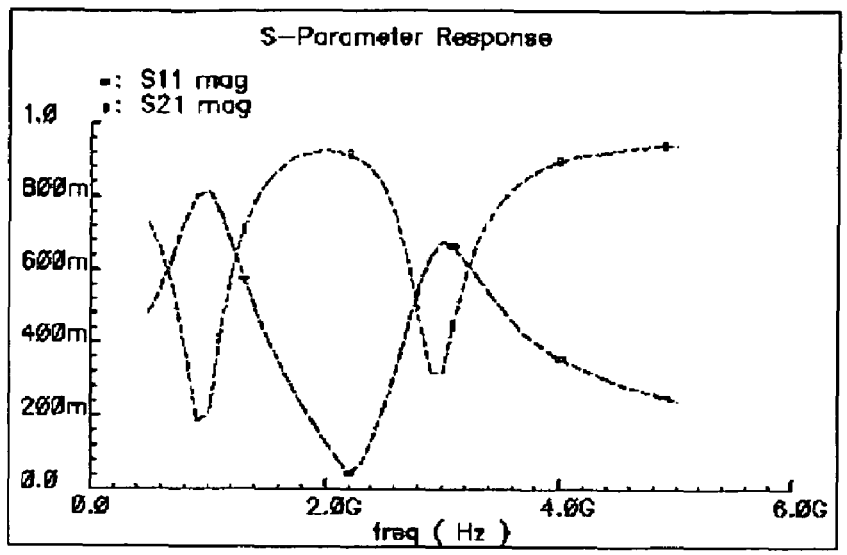
[Fig. 6]
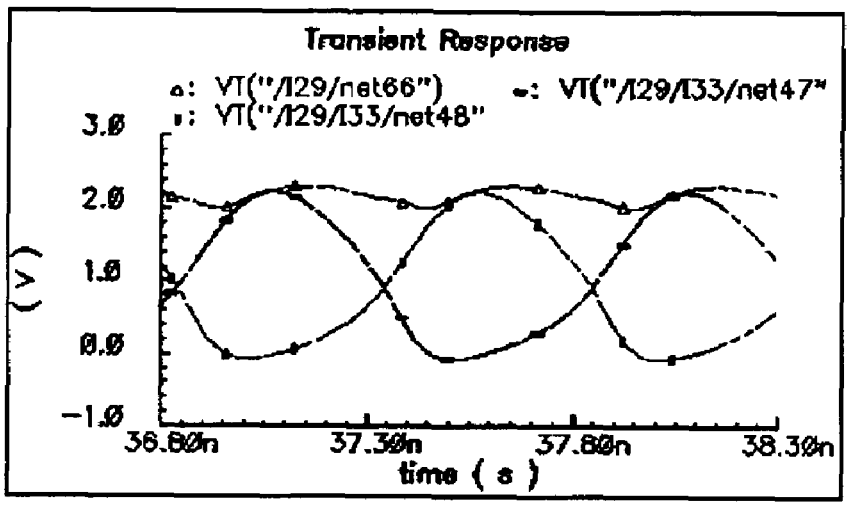
[Fig. 7]
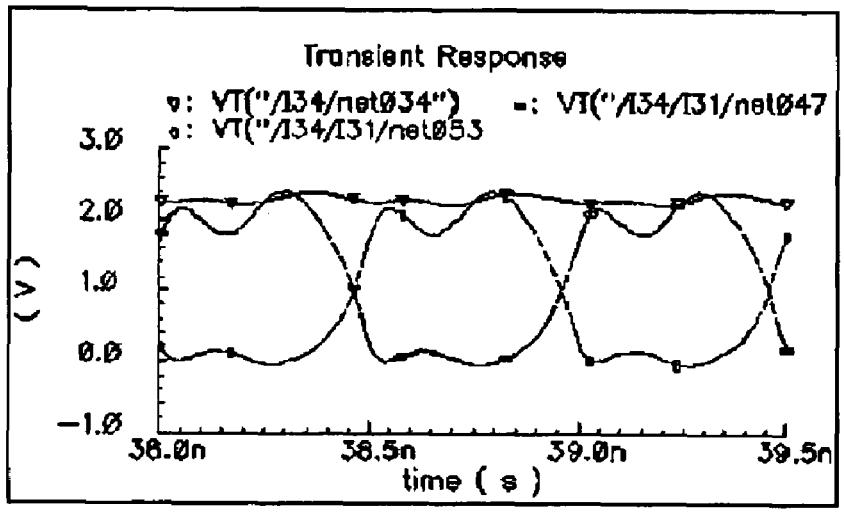

VOLTAGE-CONTROLLED OSCILLATOR USING LC RESONATOR

BACKGROUND OF THE INVENTION

1. Field of the Invention

The present invention relates to a voltage-controlled oscillator, and more particularly, to a voltage-controlled oscillator for improving a phase noise characteristic.

2. Description of the Related Art

Like most other electronic parts used for mobile communication devices, it is strongly required for voltage-controlled oscillators (VCOs) to be small and light in addition to low current consumption and low voltage operation. The VCO is a variable frequency oscillation circuit module for stably oscillating the transmitting frequency and the receiving local oscillation frequency of a mobile phone that is one of the mobile communication devices, by the application voltage of a frequency synthesizer. The VCO is used as one of the very important parts of a frequency synthesizer circuit in the mobile communication devices.

The frequency synthesizer is used as a circuit for automatically converting a frequency to an assigned phone channel for the convenience of use in the mobile communication device. The frequency synthesizer is typically constituted by a local oscillator.

A complementary metal oxide semiconductor (CMOS) type including an LC resonator is mainly used for the VCO for a high frequency. The CMOS circuit technology is widely and commercially used because of low static current consumption. Furthermore, since most semiconductor technologies converge into a CMOS technology, the CMOS circuit technology is advantageous not only for high reliability in a manufacturing process, but also for high integration.

There have been many studies to maximize the performance of the CMOS type VCO circuit including an LC resonator while maintaining the advantages of the CMOS circuit. Among them, since a phase noise characteristic is important to an oscillator circuit which operates in a radio frequency (RF) range, a study to improve the phase noise characteristic is also actively performed.

A generally well known phase noise model is introduced in a thesis entitled "A Simple Model of Feedback Oscillator Noise Spectrum" by Leeson published in Proceedings of the IEEE, vol. 54, pp. 329-330, 1966, which is represented in Equation 1.

$$L(\omega_m) \propto \frac{1}{V_o^2} \cdot \frac{KT}{C} \cdot \left(\frac{\omega_o}{Q}\right)^2 \cdot \frac{1}{\omega_m^2} \quad \text{[Equation 1]}$$

Here, $V_o$ denotes an oscillator output voltage, KT denotes a thermal noise, C denotes an equivalent capacitance, $\omega_o$ denotes a resonant frequency, Q denotes Q factor, the performance of an oscillator, and $\omega_m$ denotes a noise frequency.

This model clearly shows that the phase noise has an inclination of $1/f$, $1/f^2$, and $1/f^3$ based on the structures of the resonance circuit and oscillator. However, the Lesson model has a drawback in that it cannot clearly calculate a final phase noise value of the oscillator with an equation. To overcome the drawback, circuit designers have experimentally obtained the final phase noise value by appropriately determining an introduced proportional constant F.

SUMMARY OF THE INVENTION

To solve the above and/or other problems, the present invention provides a voltage-controlled oscillator (VCO) using a harmonic tuned LC resonator in which a harmonic tuning is added to a common resonator in which widely used inductor and capacitor are connected in parallel so that the waveform of an output voltage of the oscillator can be deformed as a designer wishes to reduce a final phase noise of the oscillator.

According to an aspect of the present invention, a voltage-controlled oscillator (VCO) using an LC resonator circuit comprises a first resonance circuit in which two serially connected varactor diodes and an inductor are connected in parallel, a second resonance circuit in which one or more inductor L1 and one or more capacitor C1 are connected in parallel, the second resonance circuit being serially connected to a port of the first resonance circuit, and a third resonance circuit in which one or more inductor L2 and one or more capacitor C2 are connected in parallel, the third resonance circuit being serially connected to the other port of the first resonance circuit.

According to another aspect of the present invention, a voltage-controlled oscillator (VCO) using an LC resonator having an inductor and a capacitor connected in parallel comprises a harmonic tuned LC resonator circuit which exhibits a characteristic of opening at an oscillation frequency and a third harmonic wave and being short-circuited at a second harmonic wave and changes an output voltage waveform of an oscillator to have a sharp inclination.

The harmonic tuned LC resonator circuit comprises an oscillation frequency resonance circuit, a common LC resonator circuit, and a third harmonic wave resonance circuit which are serially connected. The voltage-controlled oscillator comprises two pairs of latch circuits that are cross-coupled. Current is supplied to the voltage controller oscillator by a current mirror circuit.

BRIEF DESCRIPTION OF THE DRAWINGS

FIG. 1 is a circuit diagram of a VCO using a common LC resonator;

FIG. 2 is a circuit diagram of a conventional standard LC resonator;

FIG. 3 is a circuit diagram of a harmonic tuned LC resonator according to an embodiment of the present invention;

FIG. 4 is a graph showing the characteristic of the common LC resonator;

FIG. 5 is a graph showing the characteristic of the harmonic tuned LC resonator;

FIG. 6 is a graph showing the result of a computer simulation of the output waveform of the VCO using the conventional common LC resonator; and FIG. 7 is a graph showing the result of a computer simulation of the output waveform of the VCO using the harmonic tuned LC resonator according to the present invention.

DETAILED DESCRIPTION OF THE INVENTION

Referring to FIG. 1, in the circuit of a voltage-controlled oscillator (VCO) using a common LC resonator, a first differential amplifier 10 and a second differential amplifier 20 constitute a differential pair. In the first differential amplifier 10, the drain of a first MOSFET M0 is feedback to the gate of a second MOSFET M1 and the drain of the second MOSFET M1 is feedback to the gate of the first MOSFET M0. In the second differential amplifier 20, the drain of a third MOSFET M2 is feedback to the gate of a fourth MOSFET M3 and the drain of the fourth MOSFET M3 is feedback to the gate of the third MOSFET M2.

The first and second differential amplifiers 10 and 20 have output ends which are connected to an LC resonator circuit. MOSFET M11 and MOSFET M10 constitute a current mirror circuit to appropriately supply current to the differential pairs. M11 and a resister R operate as a current supply source due to the characteristic of the circuit structure.

The output of the VCO circuit shown in FIG. 1 is a differential pair and indicated by an equation that $V_0 = V_0^+ - V_0^-$ because the difference of the differential output voltage becomes an output voltage. A Vcont port signifies a controlled voltage applied to the LC resonator.

FIG. 2 shows a conventional generation LC resonator which consists of an inductor L and two varactor diodes. The varactor diode is a device in which reactance changes according to the voltage that is applied. The varactor diode has such an electric characteristic that the characteristic impedance and the resonant frequency of the LC resonator can be changed when an appropriate controlled voltage is applied the value of an equivalent capacitance (not shown) in the varactor diode changes.

FIG. 3 shows a harmonic tuned LC resonator according to an embodiment of the present invention which is designed using a 0.35 μm CMOS manufacturing process technique. The circuit includes a first resonance circuit, a second resonance circuit, and a third resonance circuit which are connected in series.

In detail, the first resonance circuit is a common LC resonator 80 in which two serially connected varactor diodes and an inductor are connected in parallel. The second resonance circuit is an oscillation frequency resonance circuit 70 in which one or more inductor L1 and one or more capacitor C1 are connected in parallel, the second resonance circuit being serially connected to a port of the first resonance circuit. The third resonance circuit is a third harmonic resonance circuit 90 in which one or more inductor L2 and one or more capacitor C2 are connected in parallel, the third resonance circuit being serially connected to the other port of the first resonance circuit.

Each of the second and third resonance circuits includes an inductor and a capacitor which are connected in parallel.

In the present invention, Equation 2 that can accurately anticipate the phase noise of the VCO is provided by inducing a constant value F with respect to the phase noise of the VCO.

$$F = 2 + \frac{8\gamma IR}{\pi V_o'} + \gamma \frac{8}{9} g_{mbias} R \quad \text{[Equation 2]}$$

Here, the three terms denote noise from the resonator, the differential pair FET, and the current supply source. "γ" denotes a channel noise constant of the MOSFET which has a value of 2-3 for a short channel and ⅔ for a long channel. The current "I" denotes the current flowing in the transistor M10. "$g_{mbias}$" denotes the transconductance of the transistor M10. And "$V_0'$" denotes inclination of an oscillator output voltage.

A widely used S-parameter interpretation preeminently shows the characteristic of a device operating in a radio frequency range like the present invention. Of the S-parameters, an S21 parameter indicating a gain is most suitable for interpreting what characteristic the LC resonator reveals.

When an S21 parameter value is 1, the gain of the LC resonator circuit is 1. In this case, since the input and output values are the same, the input and outer can be said to be short-circuited. In contrast, when the S21 parameter value is 0, the gain of the LC resonator circuit is 0 so that the input and output can be regarded to be open.

It is well known that the main reason for the phase noise is a component that is made by down-converting a noise component around $2f_0$, which is double the oscillation frequency, to around an oscillation frequency $f_0$. Thus, appropriately reducing the frequency component around $2f_0$ has a great effect on the improvement of the phase noise.

To see the effect of the present invention, the characteristics of the S21 parameter to the conventional LC resonator of FIG. 2 and the resonator according to the present invention of FIG. 3 are computer-simulated and the result of the simulation is shown in FIGS. 4 and 5.

When the oscillation frequency $f_0$ is 1 GHz, the S21 parameter of the VCO using the conventional LC resonator has the minimum value around $2f_0$ that is double the oscillation frequency $f_0$. That is, as described above, when the S21 parameter value decreases around $2f_0$, the impedance of an LC resonator circuit network decreases. Thus, as the S21 parameter value increases, the impedance of the LC resonator circuit network is short-circuited. As the S21 parameter value decreases, the impedance of the LC resonator circuit network is open.

FIG. 4 shows the result of computer simulation of the S21 parameter value of the VCO using the conventional LC resonator circuit, in which the S21 parameter value is maximized around the oscillation frequency $f_0$ of the oscillation frequency 1 GHz and minimized around $2f_0$.

In contrast, the S21 parameter of the VCO using the harmonic tuned LC resonator circuit according to the present invention is minimized around $2f_0$ that is the second harmonic wave, as shown in FIG. 5, exhibiting a characteristic of being short-circuited. Thus, the short-circuit characteristic has an effect of minimizing the phase noise. In addition, as described later, the switching characteristic of the VCO is remarkably improved.

In particular, according to the circuit operation of the present invention, when the oscillation frequency $f_0$ and a sine wave that is the third harmonic wave are summed, since an inclination $V_0'$ thereof increases, when a final phase noise can be improved. The inclination $V_0'$ is a voltage that is proportional not to the magnitude of an output voltage but to the inclination of an output waveform.

When the output waveform is made close to a rectangle by means of the harmonic tuned LC resonator, the phase noise is improved by a sharp inclination. Also, the noise added by the current supply source is reduced by the harmonic tuned LC resonator. This is because the harmonic tuned LC resonator has a short-circuit characteristic at the second harmonic wave and this characteristic makes the noise around the second harmonic wave of active and passive devices in the VCO short-circuited and the switching of a cell clear, so as to enhance the performance of the oscillator.

FIG. 6 shows the output waveform of the VCO circuit using the conventional LC resonator shown in FIG. 2 which is close to a sine wave. In contrast, the output waveform shown in FIG. 7 by the circuit of FIG. 3 which is harmonic tuned according to the present invention has an inclination sharper about 2.2 times than the conventional waveform so that the switching of the active device becomes faster, thus contributing to the phase noise characteristic. Also, since the fluctuation of a drain node voltage of the M10 connected to the current supply source is further decreased, the fluctuation of the output voltage of the VCO circuit is minimized.

The above effects of the present invention are obtained because the harmonic tuned LC resonators 70 and 90 serve as the filter insertion for minimizing the noise of the current supply source. In particular, since the harmonic tuned LC resonator has a wide frequency range, it has stronger immunity to a change in the manufacturing process of the circuit than a filter that is simply constituted by passive devices so that improve performance can be provided.

As described above, in the VCO according to the present invention, since the inclination of switching of the output voltage waveform of the VCO becomes sharper by means of the harmonic tuned LC resonator, the phase noise characteristic is improved. Also, since the second harmonic wave noise component which is a main reason for the phase noise in the VCO is removed using the short-circuit characteristic of the LC resonator, the phase noise performance of the VCO is much improved.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A voltage-controlled oscillator (VCO) using an LC resonator comprising a first differential amplifier, a second differential amplifier, a LC resonator connected to output of the first and second differential amplifier and a current source which supplies current to the first and second differential amplifier and the LC resonator, the LC resonator comprising:

a first resonance circuit in which two serially connected varactor diodes and an inductor are connected in parallel;

a second resonance circuit in which one or more inductor L1 and one or more capacitor C1 are connected in parallel, the second resonance circuit being serially connected to a port of the first resonance circuit; and a third resonance circuit in which one or more inductor L2 and one or more capacitor C2 are connected in parallel, the third resonance circuit being serially connected to the other port of the first resonance circuit.

2. The voltage-controlled oscillator (VCO) using an LC resonator of claim 1, wherein the LC resonator is a harmonic tuned LC resonator circuit which exhibits a characteristic of opening at an oscillation frequency and a third harmonic wave and being short-circuited at a second harmonic wave and changes an output voltage waveform of an oscillator to have a sharp inclination, and wherein the LC resonator plays a role in a filter in order to minimize a noise of current source.

3. The voltage-controlled oscillator using LC resonator of claim 1, wherein the first differential amplifier and the second differential amplifier are latch circuits that include cross-coupled transistors.

* * * * *